(12) United States Patent
Hagemeyer et al.

(10) Patent No.: US 7,064,377 B2
(45) Date of Patent: Jun. 20, 2006

(54) FLASH MEMORY CELL WITH BURIED FLOATING GATE AND METHOD FOR OPERATING SUCH A FLASH MEMORY CELL

(75) Inventors: Peter Hagemeyer, Dresden (DE); Wolfram Langheinrich, Dresden (DE)

(73) Assignee: Infineon Technologies AG, Munich (DE)

( * ) Notice: Subject to any disclaimer, the term of this patent is extended or adjusted under 35 U.S.C. 154(b) by 48 days.

(21) Appl. No.: 10/808,219

(22) Filed: Mar. 24, 2004

(65) Prior Publication Data

US 2004/0228187 A1    Nov. 18, 2004

Related U.S. Application Data

(63) Continuation of application No. PCT/EP02/09920, filed on Sep. 5, 2002.

(30) Foreign Application Priority Data

Sep. 24, 2001  (DE) ................ 101 46 978

(51) Int. Cl.
   *H01L 29/788*    (2006.01)
(52) U.S. Cl. ............... 257/315; 257/296; 257/314
(58) Field of Classification Search .............. 257/315, 257/314, 296
   See application file for complete search history.

(56) References Cited

U.S. PATENT DOCUMENTS

| | | |
|---|---|---|
| 5,488,243 A | 1/1996 | Tsuruta et al. |
| 5,598,367 A | 1/1997 | Noble |
| 6,011,288 A | 1/2000 | Lin et al. |
| 6,052,311 A | 4/2000 | Fu |
| 6,248,626 B1 | 6/2001 | Kumar et al. |
| 6,252,275 B1 | 6/2001 | Aitken et al. |

FOREIGN PATENT DOCUMENTS

| | | |
|---|---|---|
| JP | 59-154071 | 9/1984 |
| JP | 59-154072 | 9/1984 |
| JP | 61-078169 | 4/1986 |

OTHER PUBLICATIONS

PCT Search Report dated Feb. 10, 2003.
International Preliminary Examination Report dated Nov. 25, 2003.
German Examination Report dated Jun. 10, 2002.

*Primary Examiner*—Long Pham
(74) *Attorney, Agent, or Firm*—Patterson & Sheridan, L.L.P.

(57) ABSTRACT

A programmable read-only memory cell and method of operating the programmable read-only memory cell. In one embodiment, the programmable read-only memory cell comprises a floating gate arranged in a trench, an epitaxial channel layer formed on the floating gate, the channel layer connecting a source electrode to a drain electrode, and a selection gate arranged above the channel line.

8 Claims, 5 Drawing Sheets

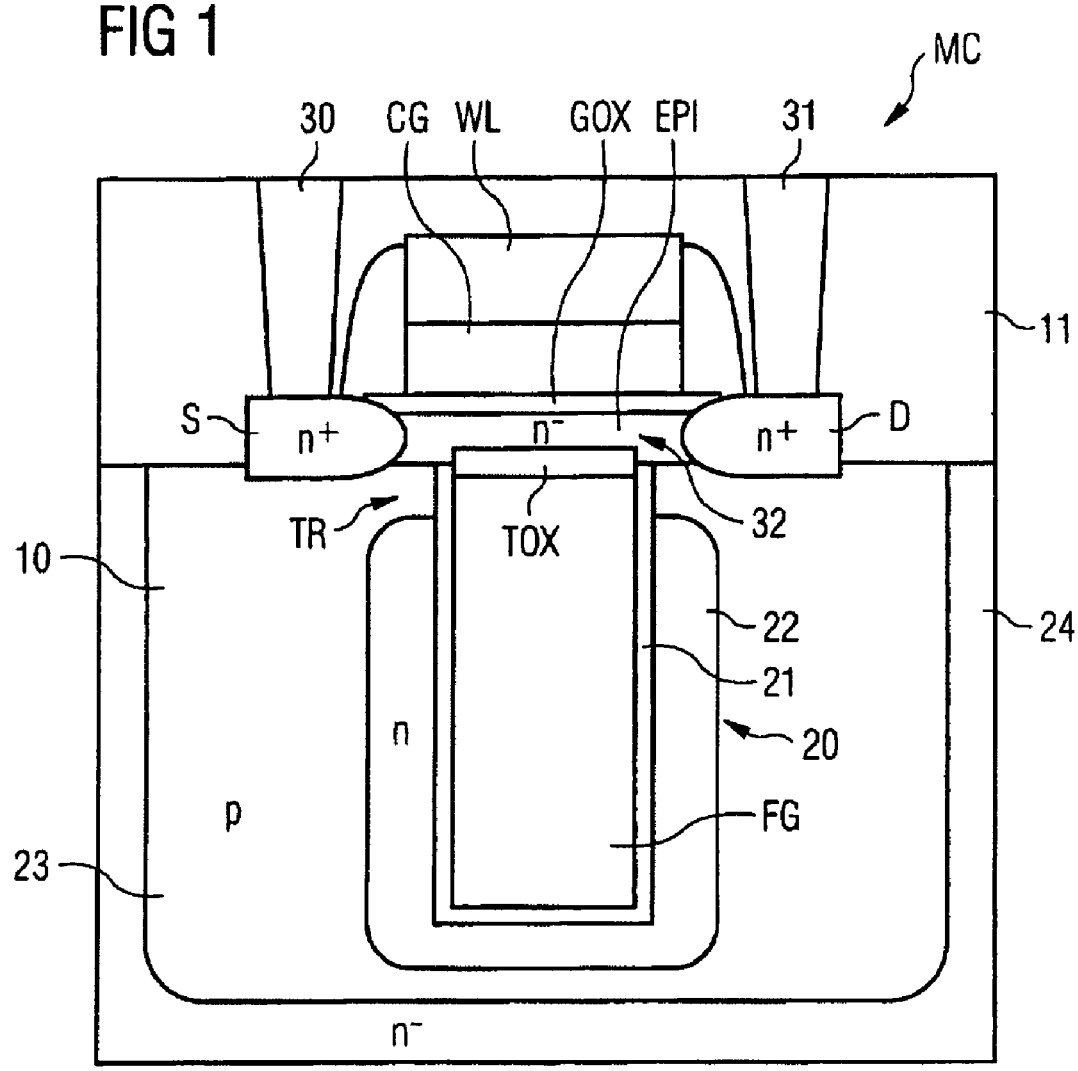

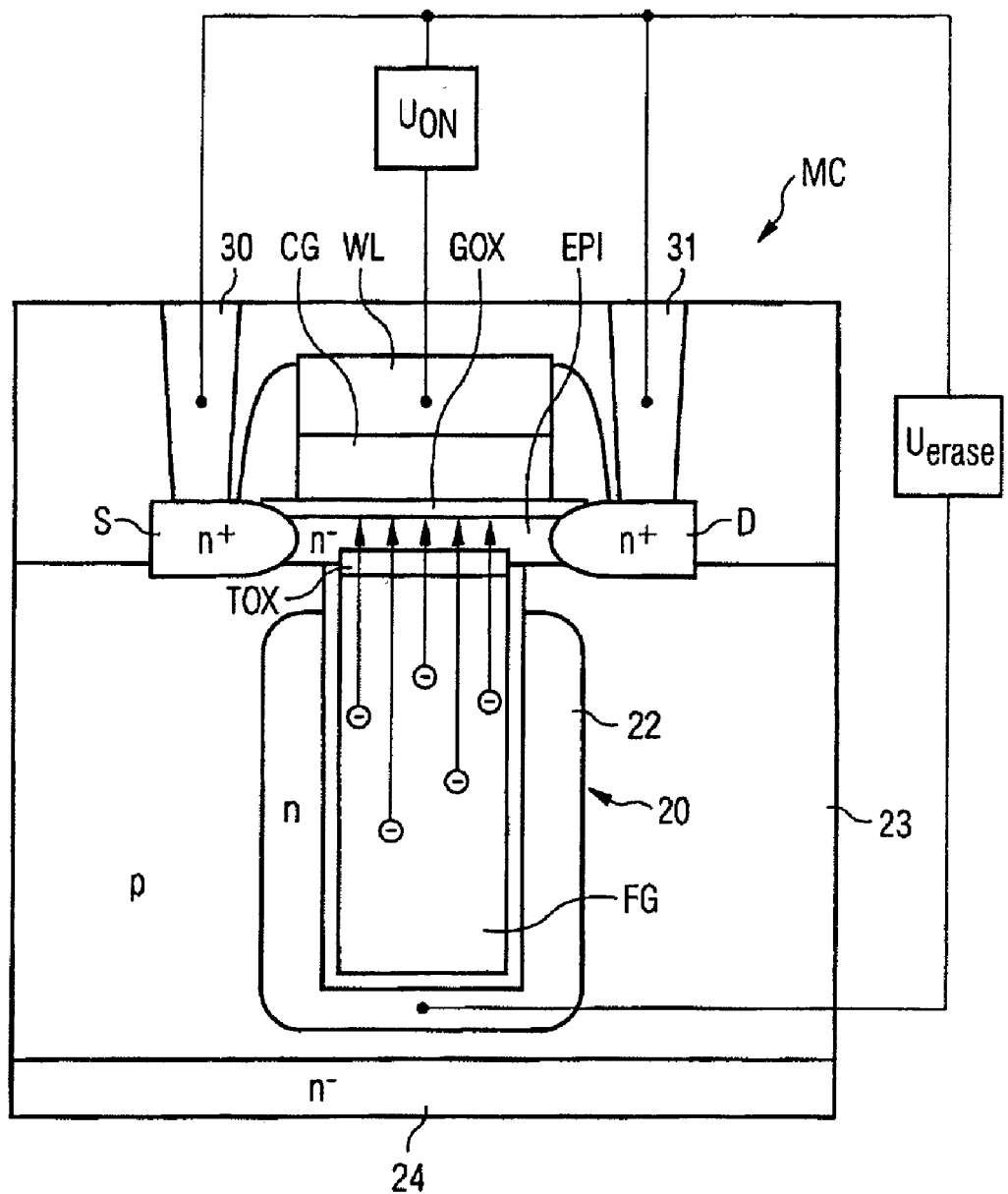

FLASH MEMORY CELL WITH BURIED FLOATING GATE AND METHOD FOR OPERATING SUCH A FLASH MEMORY CELL

CROSS-REFERENCE TO RELATED APPLICATIONS

This application is a continuation of co-pending PCT patent application No. PCT/EP02/09920, filed Sep. 5, 2002, which claims the benefit of German patent application serial number 101 46 978.0, filed Sep. 24, 2001. Each of the aforementioned related patent applications is herein incorporated by reference in their entireties.

BACKGROUND OF THE INVENTION

1. Field of the Invention

The present invention relates to a programmable read-only memory cell having a channel layer arranged between a selection gate and a floating gate.

2. Description of the Related Art

In contrast to dynamic random access memory cells (DRAMs), programmable read-only memory cells according to the principle of a flash memory can retain the stored information even without an external power supply.

Conventional flash memories generally comprise a field-effect transistor (FET) having an additional floating gate, which is formed between the selection gate (control gate) of the FET and a channel layer which connects the two source/drain regions of the FET to one another.

In this case, in the programming mode of the memory cell, a specific charge is applied to the floating gate, which is insulated from its surroundings. The conductivity of the channel layer and thus the switching state of the FET are subsequently determined. A distinction is made between "normally on" and "normally off" memory cells depending on whether the charged floating gate closes or opens the channel of the FET. In this case, it is particularly simple to read a flash memory cell, since only the conductivity of the channel is checked for this purpose.

Despite these advantages over volatile memories, flash memories are not used ubiquitously. In particular, the significantly slower programming and erasing times of this type of memory compared with the programming and erasing times of volatile memories inhibit the spread of flash memory cells.

Furthermore, constructive problems arise in the case of combined memories, where, e.g., DRAM memory cells are also fabricated on a chip in addition to the flash memory cells, on account of the different technology sequence of the two memory cell types.

U.S. Pat. No. 6,052,311 entitled "Electrically Erasable Programmable Read only Flash Memory" and U.S. Pat. No. 6,011,288 entitled "Flash Memory Cell with Vertical Channels and Source/Drain Bus Lines" disclose flash memory cells with a reduced lateral extent. Both memory cells in each case have a floating gate formed in a trench between the source and drain regions of the respective memory cell and a selection gate arranged above the floating gate. In this case, the channels run below or laterally with respect to the floating gate.

JP 59 154071 A discloses a read-only memory. Similar read-only memories are described in JP 61 078169 A, U.S. Pat. Nos. 5,488,243, 6,252,275 and 6,248,626. U.S. Pat. No. 5,598,367 discloses an EPROM which utilizes a trench capacitor structure.

SUMMARY OF THE INVENTION

It is an object of the invention to provide a read-only memory cell, an arrangement having such read-only memory cells, and a method for operating such a read-only memory cell which are distinguished by a high storage density and also by fast write and erase operations.

One object of the invention is to provide a flash memory cell which enables a higher storage density and a faster writing and erasing operation. Furthermore, it is an object of the invention to provide methods for operating such a flash memory cell.

According to one embodiment of the invention, the flash memory cell has a channel layer which is arranged between the floating gate and the selection gate and connects the source and drain electrodes to one another.

In this case, the floating gate arranged below the selection gate is arranged at least partly in a trench formed in the substrate. Vertically extending the trench into the substrate makes it possible to minimize the diameter of the floating gate and thus also the effective chip area of the memory cell.

In accordance with a further advantageous refinement of the invention, the memory cell has two separate oxide layers for the writing/erasing and reading operations. As a result of this, each of the two oxide layers and thus also the writing/erasing and reading operations connected with the respective oxide layer can be optimized separately, resulting not only in an improved tunnel oxide layer but also, in particular, shorter writing and erasing times becoming possible.

In accordance with a further advantageous refinement of the invention, the channel layer is formed as an epitaxial layer. This makes it possible to configure the channel layer to be so thin that a maximum control effect of selection gate and floating gate is achieved.

In accordance with a further refinement of the invention, the buried floating gate forms the inner electrode, a first diffusion region forms the outer electrode, and an insulator layer formed between the floating gate and the first diffusion region forms the dielectric of a trench capacitor extending into the substrate. Since the trench capacitor is formed in accordance with a trench capacitor of a DRAM memory cell, process steps can be saved during the fabrication of combined applications, where flash and DRAM memory cells are fabricated together on a semiconductor wafer. Furthermore, the constructive problems that are customary in the case of conventional flash memory cells are obviated in the case of these combined applications on account of the adapted dimensions of the two memory cell types.

On account of the construction of the flash memory cell according to the invention, in which the floating gate forms the inner electrode of a trench capacitor and the floating gate is charged and discharged capacitively via a first diffusion region forming the outer electrode of the trench capacitor, the coupling area between the floating gate and the first diffusion region turns out to be particularly large. As a result of this, the floating gate can be capacitively charged and discharged particularly effectively.

In accordance with a further advantageous refinement of the invention, the first diffusion regions of adjacent memory cells of a series of the arrangement that is perpendicular to the word line direction overlap among one another. This gives rise to a second bit line along the row of memory cells, via which bit line each memory cell can be programmed or erased.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a cross section through a flash memory cell according to one embodiment of the invention with a buried floating gate;

FIGS. 2A to 2C show the method of operation of the flash memory cell according to one embodiment of the invention from FIG. 1 during a writing operation, an erasing operation and a reading operation.

DETAILED DESCRIPTION OF THE PREFERRED EMBODIMENT

FIG. 1 illustrates the construction of a flash memory cell MC according to the invention. The memory cell MC has a floating gate FG, buried within a substrate 10 and a field-effect transistor formed above the buried floating gate FG. The illustrated embodiment of the invention shows a "normally on" memory cell, the field-effect transistor being activated in the case of an uncharged floating gate FG.

In order to reduce the chip area, the floating gate FG is accommodated completely in a trench TR formed within the substrate 10, and at the same time forms the inner electrode of a trench capacitor 20.

A thin insulator layer 21 is formed within the trench TR. The insulator layer 21 completely covers the bottom and the sidewalls of the trench TR with a uniform layer thickness and reaches as far as the substrate surface. The insulator layer 21, which may be formed as an ONO layer (oxide-nitride-oxide), serves as a dielectric of the trench capacitor 20 and insulates the floating gate FG from a first diffusion region 22 forming the outer electrode of the trench capacitor 20.

In the exemplary embodiment illustrated, the first diffusion region 22 has an n-type doping and serves for capacitively charging and discharging the floating gate FG. In order to achieve a maximum coupling capacitance between the floating gate FG and the first diffusion region 22, the trench TR is completely surrounded by the first diffusion region 22 except for its topmost region. In this case, the first diffusion region 22 is formed as a well within the substrate 10 and extends from a level below the trench TR as far as a level just below the substrate surface.

Figure 3:
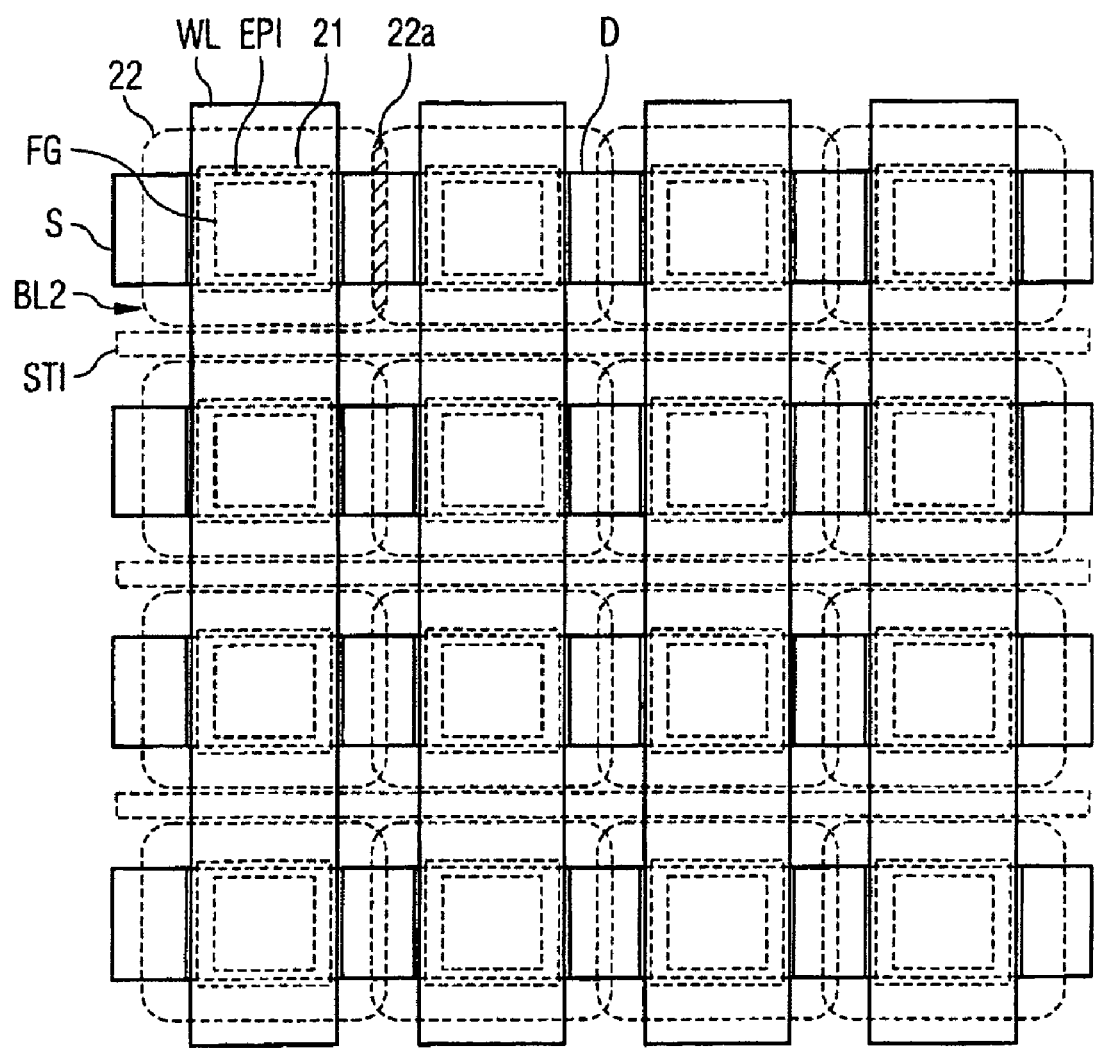
FIG. 3 shows a matrix-type arrangement of flash memory cells according to one embodiment of the invention with second bit lines formed by overlapping of the first diffusion regions.

As revealed by FIG. 3, the first diffusion regions 22 of a row of a matrix-type arrangement of flash memory cells MC overlap one another and form a second bit line BL2 for writing to and erasing the flash memory cell MC.

Figure 2A:
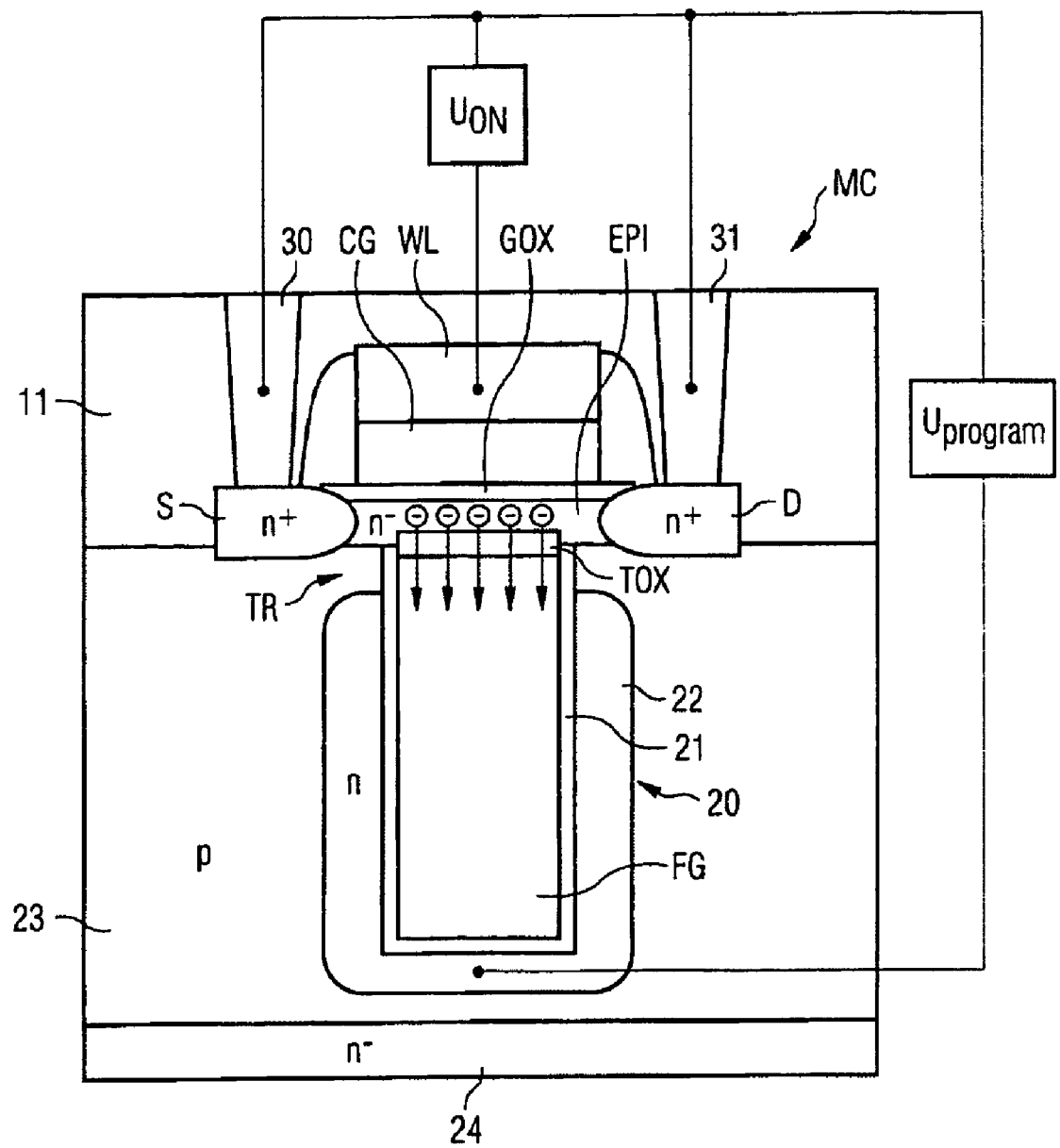
Figure 2C:
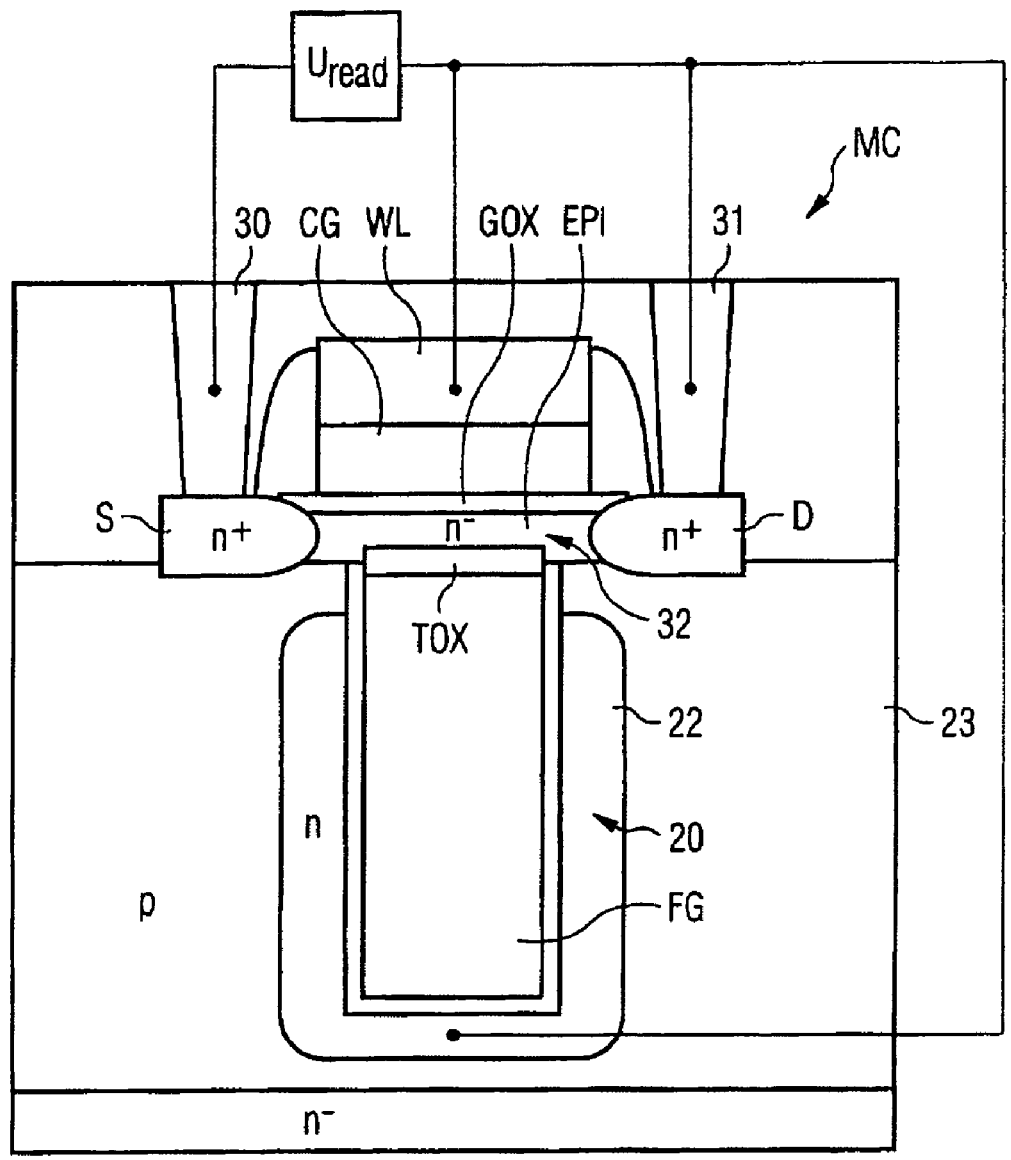

A second diffusion region 23 is provided outside the first diffusion region 22, and extends from the substrate surface to a point below the first diffusion region 22 and laterally to a point beyond the flash memory cell MC. In this case, the second diffusion region 23 is illustrated in FIG. 1 as a well comprising only a single memory cell MC. As indicated in FIGS. 2A to 2C, the second diffusion region 23 may also extend to further memory cells MC of a matrix-type arrangement. In this case, the second diffusion region 23 is formed completely within a third diffusion region 24 formed as a well or areally in the substrate 10. In this case, the second diffusion region 23 has a p-type doping and the third diffusion region 24 has an n-type doping. The specific arrangement of the diffusion regions 22, 23, 24 forms a "triple well" arrangement, the first diffusion region 22 and the third diffusion region 24 being electrically insulated from one another, independently of their respective charge states, on account of depletion layers which form at the pn junctions between the diffusion regions 22, 23, 24. A similar arrangement is formed by the n-doped source/drain electrodes S, D with the first and second diffusion regions 22, 23. In this case, the first diffusion region 22 is electrically insulated from the source/drain electrodes S, D likewise on account of depletion layers which form at the pn junctions between the diffusion regions 22, 23 and the source/drain electrodes S, D.

A thin insulator layer TOX is formed above the floating gate FG at the level of the substrate surface, and completely covers the floating gate FG. The insulator layer TOX forms the tunnel oxide of the flash memory cell MC, which charges and discharges the floating gate FG, forming the inner electrode of the trench capacitor 20, during writing and erasing operations. The thickness of the tunnel oxide layer TOX is chosen such that, on the one hand, the charge situated on the floating gate FG is insulated sufficiently well from a conductive channel layer EPI of the field-effect transistor (FET) and, on the other hand, a sufficiently high tunneling current is ensured during writing and erasing operations of the memory cell MC.

On the substrate surface, a field-effect transistor (FET) is formed above the buried floating gate FG. The source electrode S of the transistor is arranged on one side of the memory trench TR, and the drain electrode D of the transistor is arranged on the other side of said memory trench TR. A channel layer EPI extends between the source and drain electrodes S, D and electrically connects the two electrodes S, D to one another. In this case, the channel layer EPI may cover the entire tunnel layer TOX, the upper partial regions of the insulator layer 21 formed as an ONO layer, and also partial regions of the substrate surface adjoining the trench TR. In this case, the channel layer EPI may be composed of epitaxial silicon and may have an n-type doping.

A selection gate CG is formed above the channel layer EPI. The selection gate CG and the channel layer EPI are isolated from one another by a gate oxide layer GOX situated in-between. The gate oxide layer GOX formed as a thin insulator layer covers the entire channel layer EPI and also partial regions of the two source/drain electrodes S, D. A word line WL is formed above the selection gate CG and connects to one another the memory cells MC of a column of the matrix-type arrangement of memory cells MC that is illustrated in FIG. 3. In this case, the word line WL serves for the addressing of the memory cells MC in the y-direction.

The substrate surface is covered with a further insulator layer 11, in which the entire FET structure is also embedded. For the contact-connection of the source/drain electrodes S, D, a first and a second contact 30, 31 are formed in the insulator layer 11. The second contact 31 may be connected to a first bit line BL1. In this case, the first bit line BL1 (not illustrated) may run orthogonally with respect to the word lines WL of the matrix-type arrangement of memory cells MC as illustrated in FIG. 3, and in this case serves for the addressing in the x-direction.

FIG. 2A diagrammatically shows the writing operation of a flash memory cell MC analogous to that illustrated in FIG. 1. During a writing operation, the floating gate FG is charged negatively. For this purpose, electrons migrate from the channel layer EPI into the floating gate FG and, in the process, tunnel through the tunnel oxide layer TOX under a high electric field, generated by the pulling voltage $U_{program}$ formed between the channel layer EPI and the first diffusion region 22.

In order to generate the required pulling voltage $U_{program}$, the source/drain electrodes S, D may be put jointly at a negative potential $-\Phi_{program}$. By the application of a positive potential $\Phi_{ON}$ to the selection gate CG, a conductive n-channel 32 is produced within the channel layer EPI, as a result of which the channel layer EPI, which forms one of the two tunnel electrodes, is likewise brought to the source/drain potential $-\Phi_{program}$. The second tunnel electrode is formed by the first diffusion region 22. In order to generate the pulling voltage $U_{program}$, the first diffusion region 22 is put at a positive potential $+\Phi_{program}$ by a second bit line BL2. In this case, the second bit line BL2 is formed by overlap regions 22a, as illustrated in FIG. 3, of the first diffusion regions 22 of directly adjacent memory cells MC of a row of the arrangement that is perpendicular to the word line direction.

As a result of the large coupling area of the trench capacitor, the capacitive interaction between the first diffusion region 22 and the floating gate FG is so large in the floating gate FG that such a high positive potential is induced in the floating gate FG that electrons can tunnel through the tunnel oxide layer TOX.

The tunneling electrons charge the floating gate FG negatively. Since the floating gate FG is electrically insulated from its surroundings, the electrons remain within the floating gate FG even after the supply voltage has been switched off. The electric field strengths occurring between the channel layer EPI and the floating gate FG in reading operation of the memory cell MC generally do not suffice to discharge the floating gate FG again via the tunnel oxide layer TOX.

Therefore, the information unit (bit) written in the memory cell MC is ideally preserved indefinitely or until the intentional discharge of the memory cell.

FIG. 2B diagrammatically shows the erasing operation of the flash memory cell MC illustrated in FIG. 2A. In order to erase the information unit of the memory cell, the trench capacitor 20 is discharged again. In this case, the electrons that have tunneled from the floating gate FG tunnel via the tunnel oxide layer TOX into the channel layer EPI. In this case, the electrons are pulled by a high pulling voltage $U_{erase}$ formed between the first diffusion region 22 and the channel layer EPI. For this purpose, the source and drain electrodes S, D are jointly put at a positive electrical potential $+\Phi_{erase}$. Analogously to the writing operation illustrated in FIG. 2A, during the erasing operation a conductive n-channel 32 is produced in the channel layer EPI by the application of a positive electrical potential $\Phi_{ON}$ to the selection gate CG. As a result of this, the channel layer EPI, which forms one tunnel electrode, likewise acquires the positive electrical potential $+\Phi_{erase}$. By contrast, the diffusion region 22 forming the second tunnel electrode is put at a negative potential $-\Phi_{erase}$ via the second bit line BL2, which is illustrated in FIG. 3. On account of the high capacitive interaction between the first diffusion region 22 and the floating gate FG, a sufficiently high negative potential is induced in the upper region of the floating gate FG, so that electrons tunnel through the tunnel oxide layer EPI. As a result of this, the floating gate FG is completely discharged again and the memory cell MC is brought to the initial state "normally on" again.

FIG. 2 diagrammatically shows the reading operation of the flash memory cell MC. During the reading of the information stored in the memory cell MC, the conductivity of the channel layer EPI between the selection and floating gates CG, FG is evaluated. The memory cell MC is assigned one of the two logic data units "1" or "0", depending on the charge state of the floating gate FG and the resultant conductance of the channel 32. In the case of the "normally on" memory cell MC illustrated here, the channel 32 is blocked when the trench capacitor 20 is charged, and open when the trench capacitor 20 is discharged.

In order to read the flash memory cell MC, a read voltage $U_{read}$ is generated between the source and drain electrodes S, D. The source electrode S may be put at the ground potential $\Phi_{ground}$, and the drain electrode D may be put at a positive potential $+\Phi_{read}$. In this case, the selection gate CG at the first diffusion region 22 may acquire the same electrical potential $+\Phi_{read}$ as the drain electrode D.

On account of the influence field generated by the electrical potential $+\Phi_{read}$ of the selection gate CG, the channel 32 is open in the case of an uncharged floating gate FG. In this case, a detectable current flow arises in the channel layer EPI on account of the read voltage $U_{read}$ present between the source and drain electrodes S, D.

By contrast, if the floating gate FG has a negative charge, then the channel 32 within the channel layer EPI is pinched off by the influence field of the negative charge. The conductivity of the channel layer EPI is thereby reduced. The charge state of the memory cell MC is then detected on the basis of a significantly reduced or totally stopped current flow between the source and drain electrodes S, D.

The conductivity of the channel layer EPI, which corresponds to the charge state of the memory cell MC, is determined, in both cases, by a conventional evaluation circuit which, in the simplest case, checks whether a current flows between the source and drain electrodes S, D. If this is the case, then the memory cell MC is assigned an information unit "1" or "0", depending on the memory cell concept. Otherwise, the memory cell MC is assigned the respective complementary information unit.

FIG. 3 shows a plan view of a matrix-type arrangement of flash memory cells MC. In this case, the memory cells MC are arranged in in each case four columns and rows running perpendicularly to one another. A trench isolation STI, which electrically isolates the memory cells MC of a column from one another, is formed between two directly adjacent rows of the arrangement. Each of the memory cells MC of the arrangement is formed analogously to the flash memory cell MC illustrated in FIG. 1 and has in each case a floating gate FG formed in a trench TR of the substrate 10. The floating gate FG is electrically insulated from a first diffusion region 22 by an insulator layer 21. A channel layer EPI is in each case arranged above the floating gate FG, the floating gate FG being isolated from the channel layer EPI by a thin tunnel oxide layer TOX. Each channel layer EPI may be formed as an epitaxial layer and in each case connects two source/gate electrodes S, G to one another, which are arranged on both sides of the channel layer EPI. In this case, each of the source/drain electrodes S, D is assigned to two directly adjacent memory cells MC of a row of the arrangement that runs perpendicularly to the word line direction. Above the channel layer EPI, each memory cell MC has a selection gate CG, which is isolated from the channel layer EPI by a thin gate oxide layer GOX.

The memory cells MC within the matrix-type arrangement are addressed in the y-direction in each case by a word line WL. In this case, the word line WL makes contact with all the selection gates CG of the memory cells MC of a column of the arrangement.

First bit lines BL1 (not illustrated in FIG. 3) are arranged orthogonally with respect to the word lines WL and in each case make contact with the source/drain electrodes S, D of the memory cells MC of a row of the arrangement.

The first diffusion regions 22 of each memory cell MC in each case have an overlap region 22a with the first diffusion regions 22 of the two directly adjacent memory cells MC of the respective row of the arrangement that runs perpendicularly to the word line direction. The electrically conductive connection produced in this way forms a second bit line BL2, via which information is written to the memory cell MC or erased from the memory cell MC. To that end, as revealed by the description of FIGS. 2A and 2B, the first diffusion region 22 acquires a positive or negative electrical potential $+\Phi_{program}$, $-\Phi_{erase}$, respectively, via the second bit line BL2 assigned to the respective memory cell MC.

In order to carry out a reading operation, each memory cell MC of the matrix-type arrangement can be addressed individually with the aid of the word lines WL and the first bit lines BL1. The respective second bit line BL2 is additionally necessary for carrying out the writing or erasing operation of the respective memory cell MC.

While the foregoing is directed to embodiments of the present invention, other and further embodiments of the invention may be devised without departing from the basic scope thereof, and the scope thereof is determined by the claims that follow.

What is claimed is:

1. A programmable read-only memory cell, comprising:
a source electrode;
a drain electrode;
a channel layer formed between the source electrode and the drain electrode;
a floating gate isolated from the channel layer; and
a selection gate isolated from the channel layer, wherein the selection gate and the floating gate are arranged on opposite sides of the channel layer, and wherein a first insulator layer is arranged between the floating gate and the channel layer and a second insulator layer is arranged between the selection gate and the channel layer;
wherein the floating gate is arranged at least partly in a trench of a substrate, wherein the trench is formed between the source electrode and the drain electrode, and wherein the floating gate is electrically insulated from the substrate; and
wherein a trench capacitor is formed in the substrate, an inner electrode of said trench capacitor being formed by the floating gate and an outer electrode of said capacitor being formed by a first diffusion region.

2. The programmable read-only memory cell of claim 1, wherein the first diffusion region is formed within a second diffusion region and the second diffusion region is formed within a third diffusion region, the second diffusion region having a complementary doping with respect to the first diffusion region and with respect to the third diffusion region.

3. The programmable read-only memory cell of claim 1, wherein the first diffusion region of the read-only memory cell has an overlap region with one or more first diffusion regions of two read-only memory cells of a matrix-type arrangement of read-only memory cells that are directly adjacent in a direction perpendicular to a word line, and wherein the overlap region forms an electrically conductive connection between the first diffusion regions of a plurality of read-only memory cells in a series.

4. A programmable read-only memory cell, comprising:
a floating gate disposed in a trench of a substrate;
a channel layer formed over the floating gate, connecting a source electrode to a drain electrode;
a selection gate disposed above the channel layer;
a first insulator layer disposed between the floating gate and the channel layer;
a second insulator layer disposed between the selection gate and the channel layer;
an insulator layer disposed between the floating gate and the substrate; and
a trench capacitor, formed in the substrate, comprising an inner electrode formed by the floating gate and an outer electrode formed by a first diffusion region disposed between the insulator layer and the substrate.

5. The programmable read-only memory cell of claim 4, further comprising:
a second diffusion region surrounding the first diffusion region; and
a third diffusion region surrounding the second diffusion region, wherein the second diffusion region has a complementary doping with respect to the first diffusion region and with respect to the third diffusion region.

6. The programmable read-only memory cell of claim 5, wherein the first diffusion region has one or more overlap regions with one or more adjacent first diffusion regions of adjacent read-only memory cells in a direction perpendicular to a word line, and wherein the one or more overlap regions form an electrically conductive connection between adjacent first diffusion regions.

7. The programmable read-only memory cell of claim 5, wherein the channel layer is formed as an epitaxial layer having an n-type doping, and wherein the channel layer is isolated from the floating gate and the selection gate.

8. The programmable read-only memory cell of claim 5, wherein the source electrode and the drain electrode are formed at least partly on a surface of a substrate.

* * * * *